(12) United States Patent
Chan et al.

(10) Patent No.: US 8,243,520 B2
(45) Date of Patent: Aug. 14, 2012

(54) NON-VOLATILE MEMORY WITH PREDICTIVE PROGRAMMING

(75) Inventors: Nigel Chan, Munich (DE); Wolf Allers, Munich (DE); Michael Bollu, Kirchheim (DE); Dimitri Lebedev, Dachau (DE); Jan Otterstedt, Unterhaching (DE); Christian Peters, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 306 days.

(21) Appl. No.: 12/610,781

(22) Filed: Nov. 2, 2009

(65) Prior Publication Data

US 2011/0103150 A1 May 5, 2011

(51) Int. Cl.
*G11C 11/34* (2006.01)

(52) U.S. Cl. .......... 365/185.19; 365/185.33; 365/185.22

(58) Field of Classification Search ............. 365/185.19, 365/185.33, 185.22, 218, 226, 185.29, 185.09, 365/185.24, 185.17, 185.02, 185.18
See application file for complete search history.

(56) References Cited

U.S. PATENT DOCUMENTS

| | | | |
|---|---|---|---|
| 5,270,979 A | 12/1993 | Harari et al. | |
| 5,400,286 A | 3/1995 | Chu et al. | |
| 5,801,985 A | 9/1998 | Roohparvar et al. | |
| 5,909,390 A | 6/1999 | Harari | |
| 6,175,937 B1* | 1/2001 | Norman et al. | 714/718 |
| 6,188,613 B1 | 2/2001 | Manning | |
| 6,515,909 B1 | 2/2003 | Wooldridge | |
| 7,073,103 B2* | 7/2006 | Gongwer et al. | 714/718 |
| 7,088,621 B2* | 8/2006 | Guterman et al. | 365/185.18 |
| 7,646,637 B2* | 1/2010 | Liao | 365/185.05 |
| 7,799,638 B2* | 9/2010 | Yang et al. | 438/261 |
| 7,859,910 B2* | 12/2010 | Shiga | 365/185.24 |
| 7,969,806 B2* | 6/2011 | De Ambroggi et al. | 365/218 |
| 2006/0285396 A1 | 12/2006 | Ha | |
| 2009/0185441 A1* | 7/2009 | Kux et al. | 365/218 |

\* cited by examiner

*Primary Examiner* — Dang Nguyen
(74) *Attorney, Agent, or Firm* — Dicke, Billig & Czaja, PLLC

(57) ABSTRACT

A method of operating an integrated circuit includes applying at least one first programming pulse to a plurality of non-volatile memory cells to adjust a level of a storage parameter of each of the non-volatile memory cells, the at least one first programming pulse defined by a plurality of pulse parameters each having a fixed valued, and determining a fail count by measuring the number of non-volatile memory cells of the plurality of non-volatile memory cells having a storage parameter level exceeding a verify level. The method further includes determining a change in an programming behavior of the plurality of non-volatile memory cells based on the fail count, adjusting a value of at least one pulse parameter of at least one second programming pulse defined by the plurality of pulse parameters to a desired value based on the change in programming behavior, and applying the at least one second programming pulse to the plurality non-volatile memory cells.

26 Claims, 9 Drawing Sheets

NON-VOLATILE MEMORY WITH PREDICTIVE PROGRAMMING

BACKGROUND

Non-volatile memory devices are employed in a wide variety of electrical devices, such as cameras or cell phones in standalone applications and Chipcard or automotive controllers in embedded applications. One type of non-volatile memory device is an electrically erasable and programmable read-only memory (EEPROM) which employs an array of flash cells. A conventional flash cell, sometimes called a floating gate transistor memory cell, is similar to a field effect transistor, having a channel region between a source and a drain in a substrate and a control gate over the channel region. In addition, the flash cell has a floating gate between the control gate and the channel region which is separated from the channel region by a layer of gate oxide and from the control gate by an inter-poly dielectric layer so as to be electrically isolated or "floating." The array of flash cells are arranged in a grid of word lines and bit lines, with the control gate of each flash cell being connected to a word line and the drain being connected to a bit line.

According to some techniques, a flash cell is written to or programmed by applying a positive programming voltage to the control gate and a negative programming voltage to the drain, source, and body of the device so that a sufficiently large field develops across the tunnel oxide to induce Fowler-Nordheim tunneling. The voltage applied to the control gate capacitively couples to the floating gate and therefore determines the field across the tunnel oxide and therewith the amount of negative charge residing or retained on the floating gate after programming. The amount of charge, in-turn, determines the minimum voltage, or threshold voltage, that must be applied to the control gate during a reading operation to turn "on" the flash cell and conduct current between the source and drain. As the negative charge on a floating gate increases, the threshold voltage of the cell correspondingly increases.

Accordingly, the amount of charge stored on the floating gate during writing and erasing is used to set a memory or logic state of the flash cell. Note that, according to the present disclosure, the terms "writing" and "erasing" are each defined or considered to be "programming" of the flash cell. For example, a flash cell erased or programmed with a relatively low charge will have a threshold voltage at the low end of the threshold window and may represent a logic "1", while a flash cell written to or programmed with a relatively high charge will have a threshold voltage at the high end of the threshold window and may represent a logic "0", or vice-versa. In some EEPROM memories, the amount of charge can be programmed so as to represent more than two logic states. For example, in principle, each distinct threshold voltage level within the threshold window may be used to designate a definite memory state of the flash cell.

To read a flash cell, according to one technique, an operating or read voltage is applied to the control gate while grounding the source and the substrate. The level of current flowing between the source and the drain is sensed and converted to a voltage which is compared to one or more reference voltages in a sense amplifier to determine the programmed state of the flash cell for the given read voltage. The magnitude of current drawn by a flash cell being read depends on the amount of charge stored in the floating gate.

Typically, the read voltage is at a level near the midpoint of the threshold window. If the threshold voltage of the cell is less than the read voltage, the flash cell will turn "on" and conduct current, with the current being greater the further the threshold voltage is below the read voltage. Conversely, if the threshold voltage is greater than the read voltage, the flash cell will remain "off". In order to guarantee reliability, there must be a gap or separation between the threshold voltages associated with the logic states so that the logic states of the cells can be reliably determined. For example, if a read voltage of 3 volts is employed, it may be preferred that a flash cell desired to be at a logic state of "1" have a threshold voltage less than 2 volts and a flash cell desired to be at a logic state of "0" of greater than 4 volts. Separating the threshold voltages associated with the logic states ensures adequate read current as well as improves the reliability of sensing.

In conventional flash memory devices, data is stored by first programming the flash cells to low threshold voltage (i.e. erasing) and then programming the flash cells to a target threshold voltage representative of the data (i.e. writing). According to one technique, a flash cell is erased or programmed to a low threshold voltage by applying an erase pulse having a negative voltage magnitude for a defined time to the control gate while the drain, source, and body of the transistor are held at a positive voltage. As a result, electrons in the floating gate are induced to pass through the gate oxide to the body by Fowler-Nordheim (FN) tunneling such that the charge in the floating gate is reduced, thereby reducing the threshold voltage of the flash cell. Other erase techniques can also be employed.

Typically, blocks of cells are erased simultaneously, such as a complete row or a group of rows in an array, for example. After such a block erase, not all cells of the block will have exactly the same threshold voltage, but will have a normal distribution of threshold voltages due to the variations between cells.

One problem associated with EEPROMs is that after repeated programming cycles (i.e. writing and erasing), there is a change in the programming behavior of the cells (i.e. the write behavior and the erase behavior). This change is normally caused by an accumulation of trapped charges in proximity to the floating gate which can affect either the reading of the cell and/or the electron tunneling characteristics during writing and erasing. Such effects are sometimes referred to as endurance or cycling degradation. Over time, the accumulation of trapped charges from such cycling changes the threshold voltage distribution of the blocks of cells when in the erased state. Generally, cycling degradation causes an increase in the threshold voltages over time following a given erase scheme which, as a result, narrows the threshold window by raising the low end of the threshold window. Eventually, the erased threshold voltage of some cells may be increased to a level that causes errors in reading the proper state of the cell with the given erase scheme and, ultimately, limits the allowable number of cycles of the memory.

Several techniques have been developed to address this issue, each of which fits into one of two general categories. The first category includes those techniques that require a counter which holds a cycle count for a defined portion of the memory. According to one such technique, by recording the cycle count, the read level can be adjusted at one or more predetermined cycle counts based on known cycling degradation characteristics of the memory and thereby maintain the window for a larger number of cycles. Alternatively, the program bias conditions (i.e. the writing and erasing bias conditions) can be changed as a function of cycle count based on the known cycling degradation characteristics of the memory.

The second category includes those techniques that employ some form of iterative pulsing, sometimes referred to as distribution shaping, which are typically characterized by many iterations of programming (write/erase) and verify (read) steps. One such approach is an incremental step pulse programming (or erase) scheme, where the programming (or erase) voltage is applied to the cell in steps of increasing magnitude. A verify (read) is done after each step (pulse) to determine if a predetermined number of memory cells have reached a target threshold voltage level, at which point the pulsing is stopped. Another approach involves iterating between writing and erasing and individually selecting bits in order to reduce the variation of threshold voltages among a large number of cells. There are many variations of this approach, but all iterate between programming and erasing.

While such techniques are generally successful at improving the performance and extending the life of the memory devices, each has its drawbacks. For example, those techniques employing a counter require that the count be stored, which requires extra system complexity and space for storing and reading out the information. Pulsing techniques require a large amount of time to iterate between the erasing and/or writing and verifying the cell threshold level. Additionally, variable pulses can result in a program and erase throughput which is dependent on cycle count. Often times, anywhere from ten to twenty steps are required to achieve a desired cell distribution.

For these and other reasons, there is a need for the embodiments of the present disclosure.

SUMMARY

One embodiment provides a method of operating an integrated circuit including applying at least one first programming pulse to a plurality of non-volatile memory cells to adjust a level of a storage parameter of each of the non-volatile memory cells, the at least one first programming pulse defined by a plurality of pulse parameters each having a fixed value, and determining a fail count by measuring the number of non-volatile memory cells of the plurality of non-volatile memory cells having a storage parameter level exceeding a verify level. The method further includes determining a change in an programming behavior of the plurality of non-volatile memory cells based on the fail count, adjusting a value of at least one pulse parameter of at least one second programming pulse defined by the plurality of pulse parameters to a desired value based on the change in programming behavior, and applying the at least one second programming pulse to the plurality non-volatile memory cells.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. It is to be understood that the features of the various exemplary embodiments described herein may be combined with each other, unless specifically noted otherwise. The following detailed description, therefore, is not to be taken in a limiting sense, and the scope of the present invention is defined by the appended claims.

Figure 1:
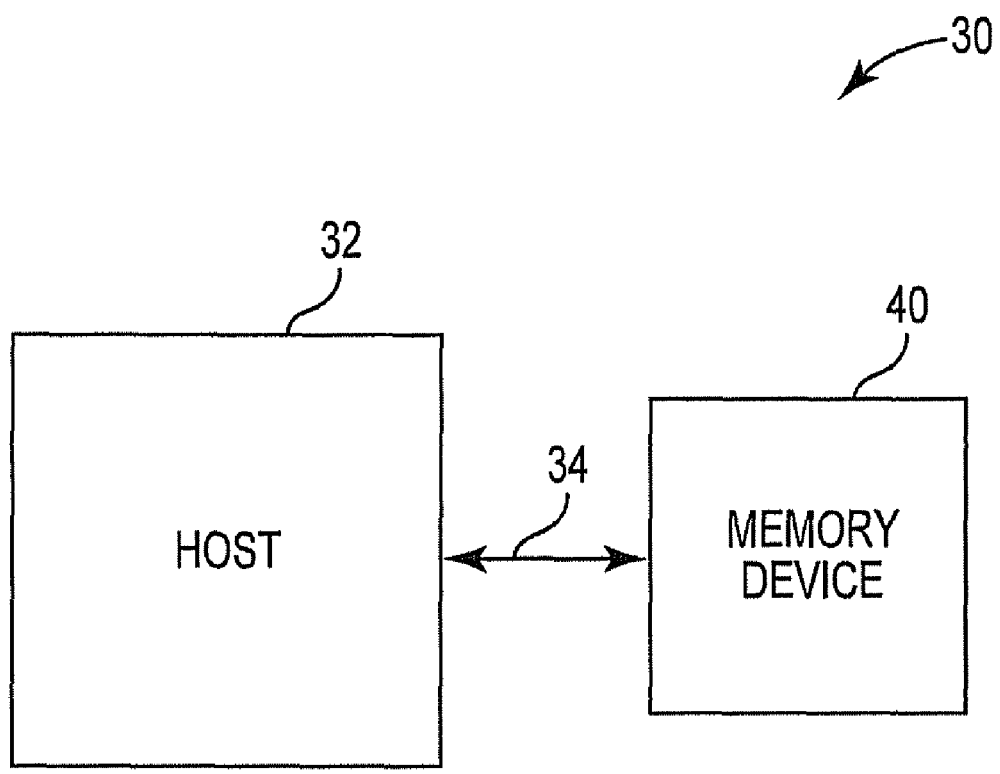
FIG. 1 is a block diagram generally illustrating an example of a system including a non-volatile memory device, according to one embodiment.

FIG. 1 is a block diagram generally illustrating an example of a system 30 including a host device 32 and a non-volatile memory device 40 employing a predictive programming scheme, according to embodiments of the present disclosure, which provides increased endurance of memory device 40. According to one embodiment, memory device 40 is an electrically erasable programmable read only memory (EEPROM). Host device 32 is communicatively coupled to EEPROM 40 through a communication link 34. Host 32 can be any number of devices, on-chip or externally connected to the EEPROM 40, including an on-chip controller or external device such as computer (e.g. desktop, laptop, handheld), a portable electronic device (e.g. cellular phone, personal digital assistant (PDA), MP3 player, video player, digital camera), or any device that uses non-volatile memory.

Figure 2:
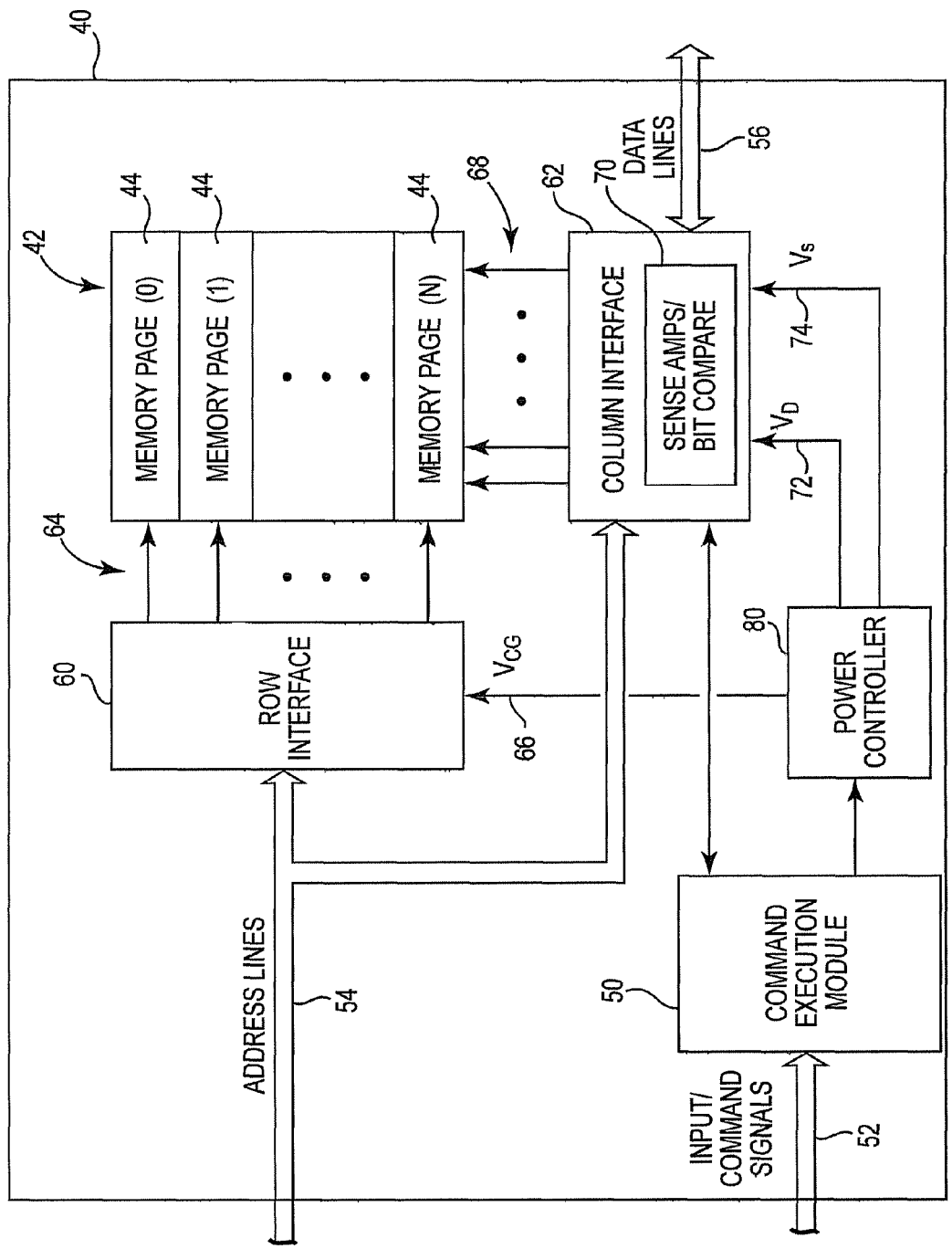
FIG. 2 is a block and schematic diagram generally illustrating one embodiment of an EEPROM, according to one embodiment.

FIG. 2 is a block and schematic diagram generally illustrating portions of EEPROM 40, according to one embodiment. In one embodiment, EEPROM 40 is an integrated circuit or part of an integrated circuit. EEPROM 40 includes an array 42 of floating gate transistor memory cells, or flash cells, arranged in a plurality of blocks or pages 44. A command execution module 50 receives, via a control bus 52, commands or interface signals from a controller. Other interface signals received from the external controller include address signals received via address lines 54. Input/output data is received/sent by/from EEPROM 40 via data lines 56. Command execution module 50 controls operations required for programming (i.e. writing and erasing) and reading the flash cells of array 42, such as page erase operations of pages 44 of array 42 according to the predictive programming scheme of the present disclosure, through a row interface 60 and a column interface 62.

Row interface 60 provides access to selected rows of flash cells of array 42 via wordlines (WL) 64 which are electrically connected to control gates of the flash cells of array 42, and selectively connects a control gate voltage $V_{CG}$ on line 66 to the control gates of the flash cells of selected rows. Column interface 62 provides access to selected columns of flash cells of array 42 via bitlines (BL) 68 which are electrically coupled to drain terminals of the flash cells of array 42, and selectively connects a drain terminal voltage $V_D$ on line 72 to the drain terminals of selected columns. A source terminal voltage $V_S$ on line 74 (e.g. ground) is connected selectively to the source terminals of the flash cells of array 42 via column interface 70. A bulk terminal voltage $V_B$ is connected to the bulk of the array. Column interface 70 further includes sense amplifiers and write/erase bit compare and verify circuits 70, which are coupled to exchange data via data lines 56.

A power controller 80 is controlled by command execution module to provide program, erase, and read voltage levels, as directed by command execution module 50, for control gate voltage $V_{CG}$, drain terminal voltage $V_D$, source terminal voltage $V_S$, and bulk terminal voltage $V_B$ on lines 66, 72, and 74. According to one embodiment, power controller 80 is configured to provide said voltage levels over a continuous range of voltages. In other embodiment, power controller 80 is configured to provide said voltages in discrete steps.

Figure 3:
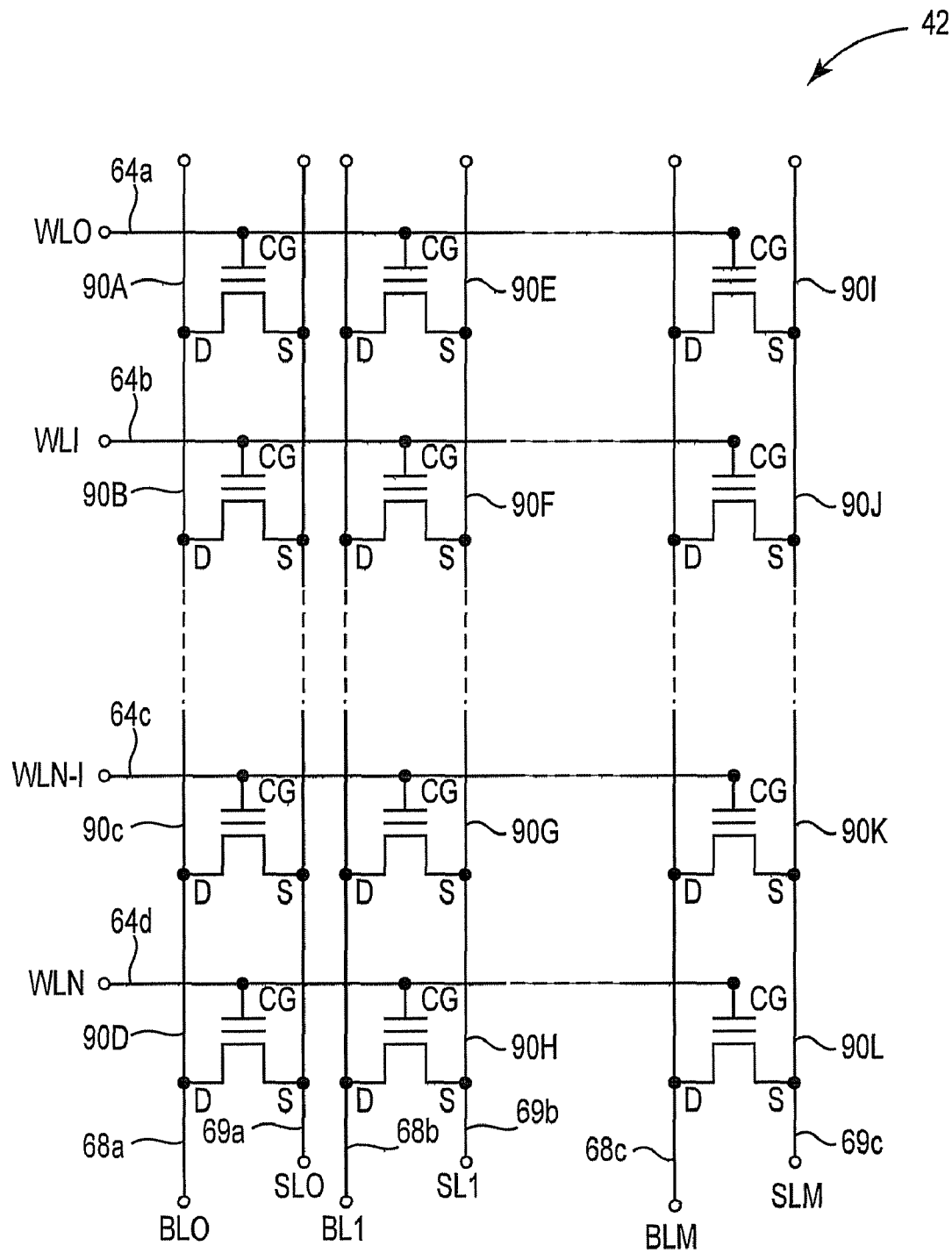
FIG. 3 is a schematic diagram generally illustrating an array of flash cells of the EEPROM of FIG. 2.

FIG. 3 is a schematic diagram generally illustrating a portion of array 42 consisting of flash cells 90A-90L, according to one embodiment. For ease of illustration, it is noted that some flash cells have been omitted from FIG. 3. Array 42 includes word lines 64a-64d, bitlines 68a-68c, and source lines 69a-c. Flash cells 90 are arranged in rows and columns, with all flash cells 90 in a particular row have control gates connected to a common word line 64, and all flash cells 90 in a particular column have drain terminals D connected to a common bitline 68 and source terminals S connected to a common sourceline 69.

One of the flash cells 90 of array 42 is selected based according to address signals on address lines 54 (see FIG. 2). The flash cell is selected by row interface 60 which selects a word line 64 and by column interface 62 which selects a bit line 68 and source line 69 in response to the address signals. The selected word line 64, selected bit line 68, and selected source line 69 are connected to the selected flash cell.

According to one embodiment, to program or write data to the selected flash cell, command execution module 50 directs power controller 80 to provide programming voltages in the form of control gate voltage $V_{CG}$ to row interface 60 via line 66, drain voltage $V_D$ to column interface 62 via line 72, source voltage $V_S$ line 69 via line 74, and body voltage $V_B$.

According to one embodiment, to read the selected flash cell, command execution module directs power controller 80 to provide gate control voltage $V_{CG}$ at a desired read level to row interface 60 via line 66, a drain voltage $V_D$ to column interface 62 via line 72, and to ground source line 69 via line 74 (i.e. $V_S=0$). According to one embodiment, to erase the selected page, command execution module 50 directs power controller 80 to provide a control gate voltage $V_{CG}$ in the form of an erase pulse to row interface 60 via line 64, to provide a source voltage, drain voltage, and body voltage ($V_S$, $V_D$, $V_B$) to column interface 62 via line 74.

As described earlier, cycling degradation causes the erased threshold voltage, $V_{TE}$, of flash cells to increase over time and to eventually reach levels which may cause memory errors and failures, which ultimately limit the life of the memory by limiting the allowable number of program/erase cycles. Embodiments of a predictive or adaptive programming scheme, in accordance with the present disclosure, which compensates for the effects of cycling degradation and increases the allowable number of program/erase cycles of a flash memory device, are described below.

As mentioned above, due to the variability in the physical dimensions and properties the flash cells resulting from fabrication variations, a Fowler Nordheim (FN) erase of a large enough sample of flash cells, such as a page 44 of flash cells 90, results in a Gaussian distribution of erased threshold voltages, $V_{TE}$, of the flash cells. According to one embodiment, each page 44 includes 2,240 flash cells 90. It is noted that, due to this flash cell variability, erase schemes other than a FN erase will also result in such a Gaussian distribution in $V_{TE}$. According to embodiments of the present disclosure, this Gaussian distribution enables a change in a number of flash cells of a given sample which have a $V_{TE}$ exceeding a selected verify level (i.e. a selected verify read level) to be converted directly into a cycling degradation of the sample of flash cells.

Figure 4:
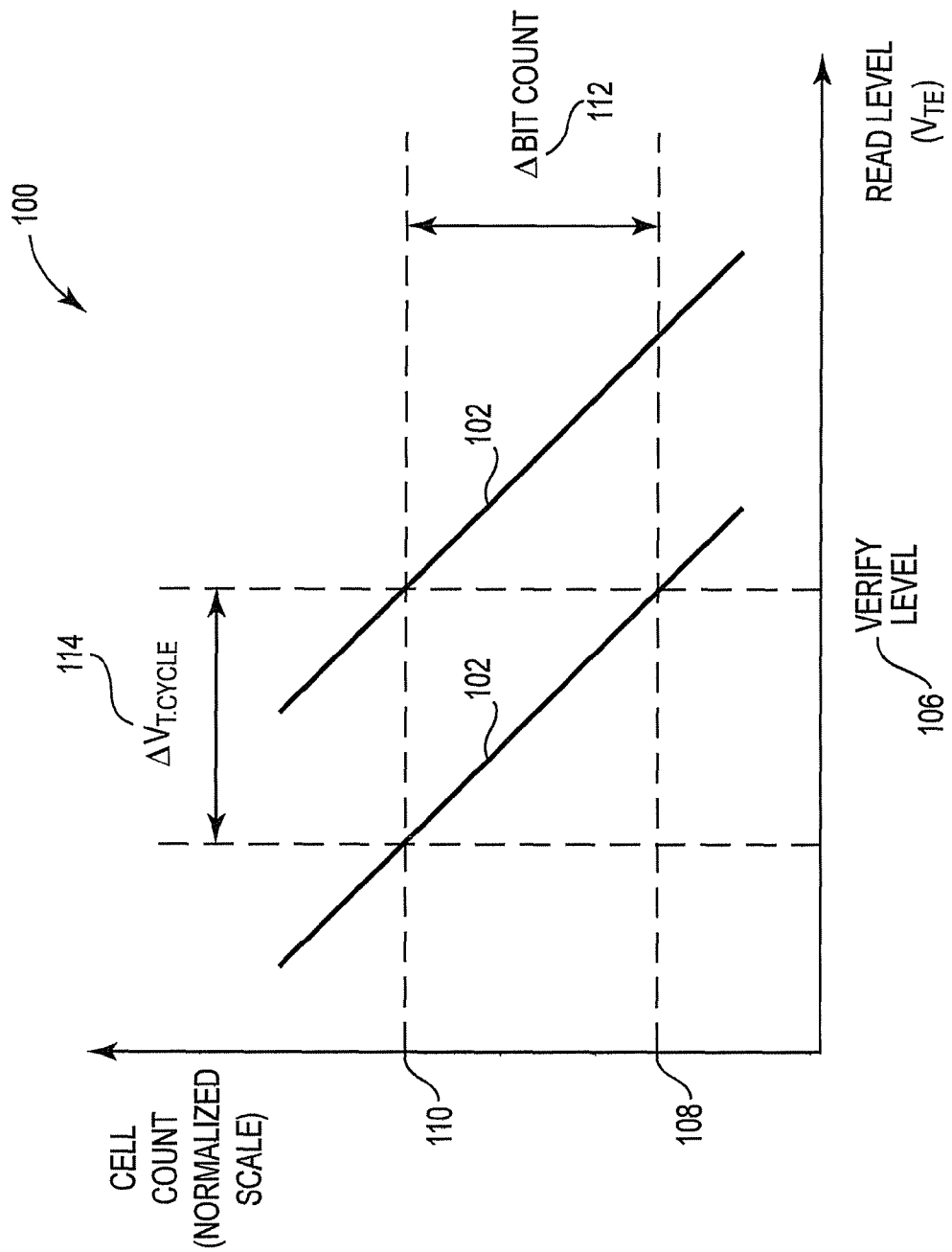
FIG. 4 is a graph generally illustrating the normal cumulative Gaussian distribution of a sample of a number of flash bits versus read level.

FIG. 4 is a graph 100 which illustrates the Gaussian distribution the number of flash cells, or bit count, of a sample of flash cells (e.g. a page 44 of flash cells 90) versus read level voltage after application of a given erase pulse both at a beginning of life (i.e. before cycling) and after cycling (i.e. post cycling). The read level voltage (i.e. $V_{TE}$) is indicated on the x-axis, and the number of bits in the sample exceeding the read level is indicated on the x-axis. It is noted that the y-axis represents the inverse of the standard normalized cumulative distribution of the bit count (i.e. inverse of the standard normalized cumulative distribution of the number of bits of the sample which exceed the $V_{TE}$), which results in a linearization of the typical bell-shaped Gaussian distribution curve. The bits on the y-axis are sometimes referred to herein as "fail bits".

Curve 102 represents the Gaussian distribution of the sample of flash cells after application of a given erase pulse prior to cycling of the flash cells (i.e. at the beginning of life), and curve 104 represents the Gaussian distribution of sample of flash cells after application of the given erase pulse after the memory has been cycled (e.g. after 1,000 write/erase cycles). From a change in the number of fail bits at a given verify level between the initial Gaussian distribution of curve 102 and the post-cycling Gaussian distribution of curve 104, the change in the erase behavior of the sample of flash cells caused by cycling, the so-called cycling degradation, can be determined.

With reference to the example of FIG. 4, at a given verify level 106, the page of flash cells initially has a number of fail bits 108 with a $V_{TE}$ exceeding verify level 106, and after cycling, has a number of fail bits 110 with a $V_{TE}$ exceeding verify level 106. A difference between the number of fail bits 110 after cycling and the number of fail bits 108 before cycling is indicated at 112. Because of the linear characteristics of the normalized plots (i.e. linear and having a known slope), fail bit change 112, also referred to simply as fail bit count 112, can be used to directly calculate the cycling degradation $\Delta V_{T\_CYCLE}$ 114, or "erase behavior", of the page of flash cells. In FIG. 4, $\Delta V_{T\_CYCLE}$ 114 equates to how far the $V_{TE}$ distribution before cycling (i.e. curve 102) has shifted to the right. In other words, it is a quantization of the effects observed due to the trapped charges associated with cycling.

As described in greater detail below, this determined or measured cycling degradation $\Delta V_{T\_CYCLE}$ 114 is employed by the predictive or adaptive erase scheme of the present disclosure to adjust the erase scheme to compensate for cycling degradation.

According to one embodiment, the predictive erase scheme of the present disclosure includes applying at least one first erase pulse to the flash cells of a page of flash cells of a non-volatile memory, such as flash cells 90 of page 44 of EEPROM 40. According to one embodiment, an FN erase scheme is employed, with the first erase pulse being applied to the control gates, CG, of the flash cells of the page. According to one embodiment, the first erase pulse has a plurality of parameters having fixed levels, including a fixed voltage level and a fixed width or erase hold time. Depending on whether the page of flash cells is at the beginning of life or has undergone cycling, the page of flash cells will have a Gaussian distribution of bits similar to curve 102 or curve 104 of FIG. 4.

As described above with respect to FIG. 4, after application of the first erase pulse, the flash cells of the page are read using a selected verify read level (e.g. verify level 106 in FIG. 4), and a number of fail bits at the selected verify read level 106 is measured or counted. This is referred to as the post-cycling fail bit count, for example, bit count 110 in FIG. 4. Although verify read level 106 can be a somewhat arbitrary level, it normally has a level less than an expected median $V_{TE}$ of the page of flash cells after application of the first erase pulse. Additionally, verify read level 106 is generally selected so as to be less than a normal read level.

According to one embodiment, during manufacture or upon initial operation of the memory device (i.e. at the beginning of life of the page of flash cells) the number of fail bits at selected verify read level 106 is measured after application of the first erase pulse. This is referred to as the pre-cycling fail bit count, for example, bit count 108 of FIG. 4. The fail bit count 112 is then determined by subtracting the pre-cycling fail bit count (e.g. bit count 108) from the post-cycling bit fail bit count (e.g. bit count 110). Based on the fail bit count 112, the cycling degradation $\Delta V_{T\_CYCLE}$ 114 of the page of flash cells is determined, such as described above by FIG. 4. In essence, by knowing the $V_{TE}$ characteristics of the page of flash cells at the beginning of life after application of the first erase pulse, including the number of fail bits at the selected verify read level, fail bit count 112 can be converted directly into the cycling degradation $\Delta V_{T\_CYCLE}$ 114 for the page of memory cells. In one embodiment, in lieu of measuring the pre-cycling fail bit count 108, which requires the storage of the fail bit count within memory 40, an expected pre-cycling or beginning of life fail bit count is employed (e.g. a pre-cycling fail bit count 108 of zero) which requires no measurement or storage.

According to one embodiment, based on the determined cycling degradation $\Delta V_{T\_CYCLE}$ 114 for the page of flash cells (i.e. the fail bit count), one or more parameters for at least one second erase pulse are determined (e.g. voltage level and erase hold time) such that when the second erase pulse is applied to the page of flash cells (i.e. after application of the first erase pulse), the $V_{TE}$ distribution of the page of flash cells is at a desired level.

Figure 5A:
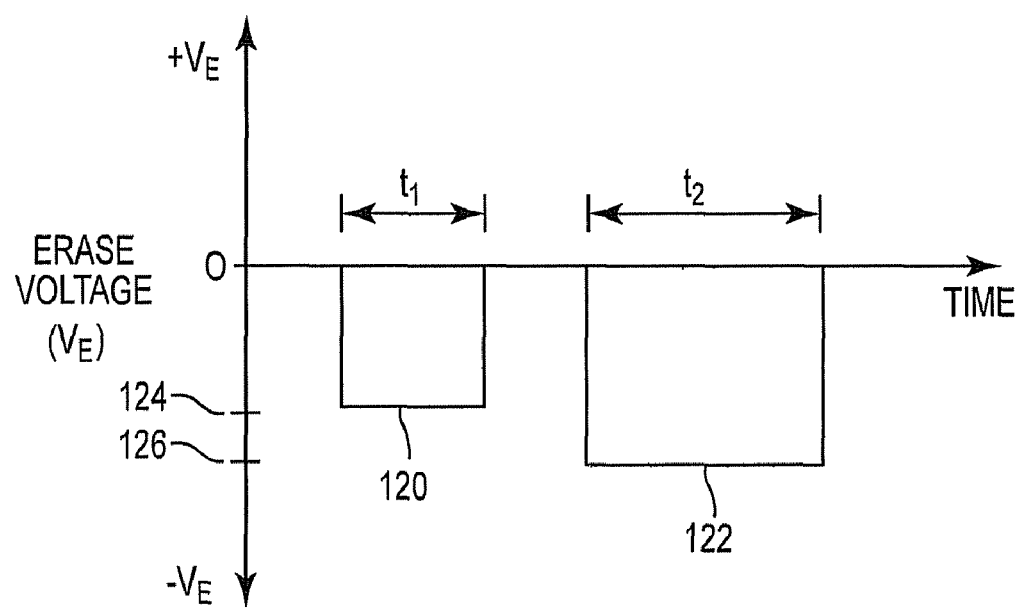
FIG. 5A is a graph generally illustrating first and second erase pulses, according to one embodiment.
Figure 5B:
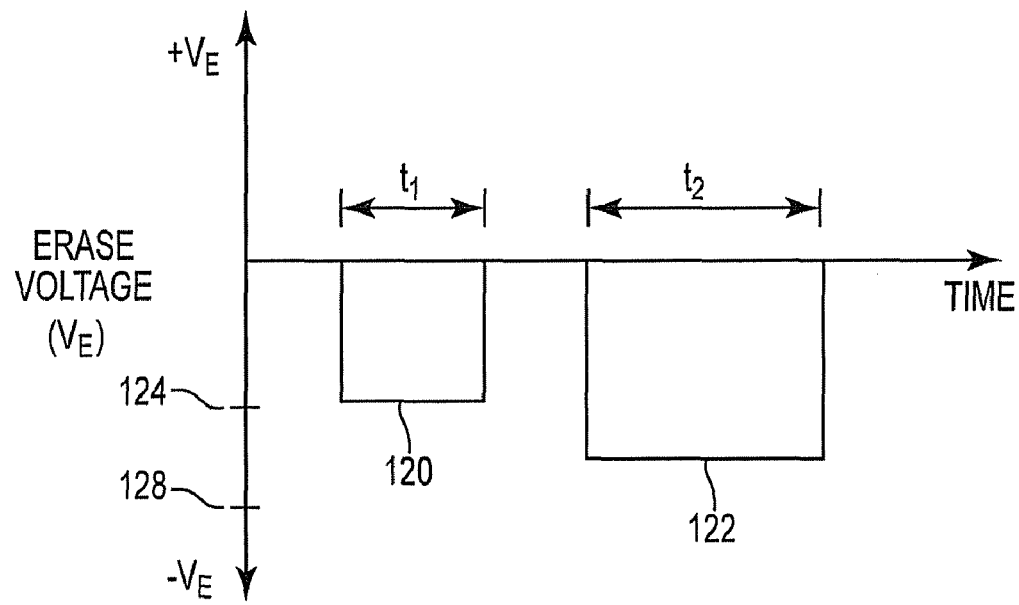
FIG. 5B is a graph generally illustrating first and second erase pulses, according to one embodiment.

According to one embodiment, the second erase pulse has a fixed erase hold time and a voltage level of the second erase pulse is adjusted based on $\Delta V_{T\_CYCLE}$ 114, such that the total or combined erase hold time of the first and second erase pulses is fixed over a life of the memory. FIGS. 5A and 5B illustrate such an embodiment. FIG. 5A and 5B respectively illustrate first and second erase pulses 120 and 122 after 500 and 1000 cycles, for example. In each case, first erase pulse 120 has an erase voltage level 124 and erase hold time $t_1$.

Similarly, in each case, second erase pulse 122 has a fixed erase hold time $t_2$, but an erase voltage level 126 in the first case and, due to greater cycle degradation, an erase voltage level 128 in the second case, erase voltage level 128 being greater than erase voltage level 126. As such, according to such an embodiment, the erase pulses have a combined erase hold time that is fixed and equal to the sum of $t_1$ and $t_2$ over a life of the memory device.

According to one embodiment, a voltage level of the second erase pulse is fixed (e.g. at a same voltage level as the first erase pulse), and an erase hold time of the pulse is adjusted based on the fail bit count. According to other embodiments, both a voltage level and an erase hold time of the second erase pulse are adjusted based on the measured fail bit count. According to one embodiment, more than one first erase pulse is employed, wherein each of the first erase pulses have fixed parameters. According to one embodiment, more than one second erase pulse is employed, wherein each of the second erase pulses have parameters which may be individually adjusted based on the fail bit count.

Figure 6:
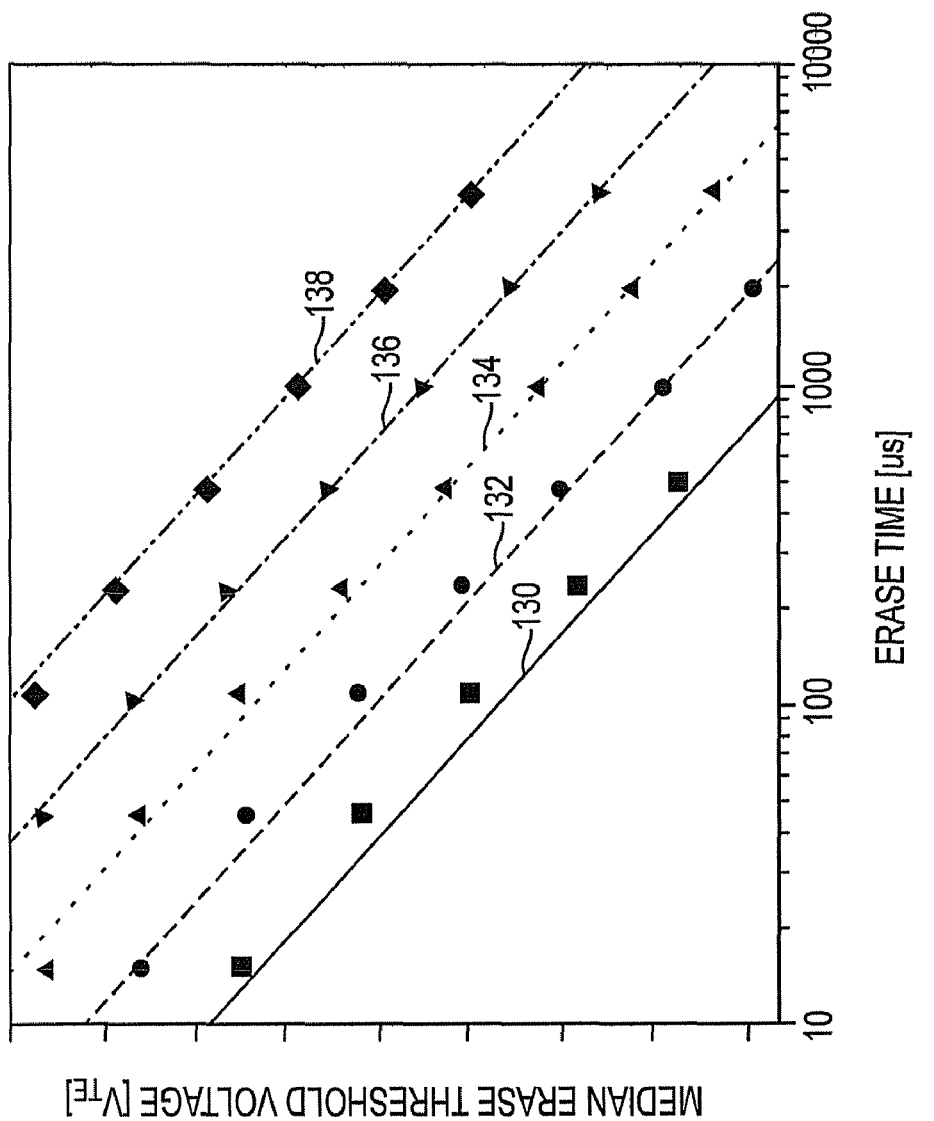
FIG. 6 is a graph illustrating the modeled FN erase characteristics for sample of flash cells
Figure 7:
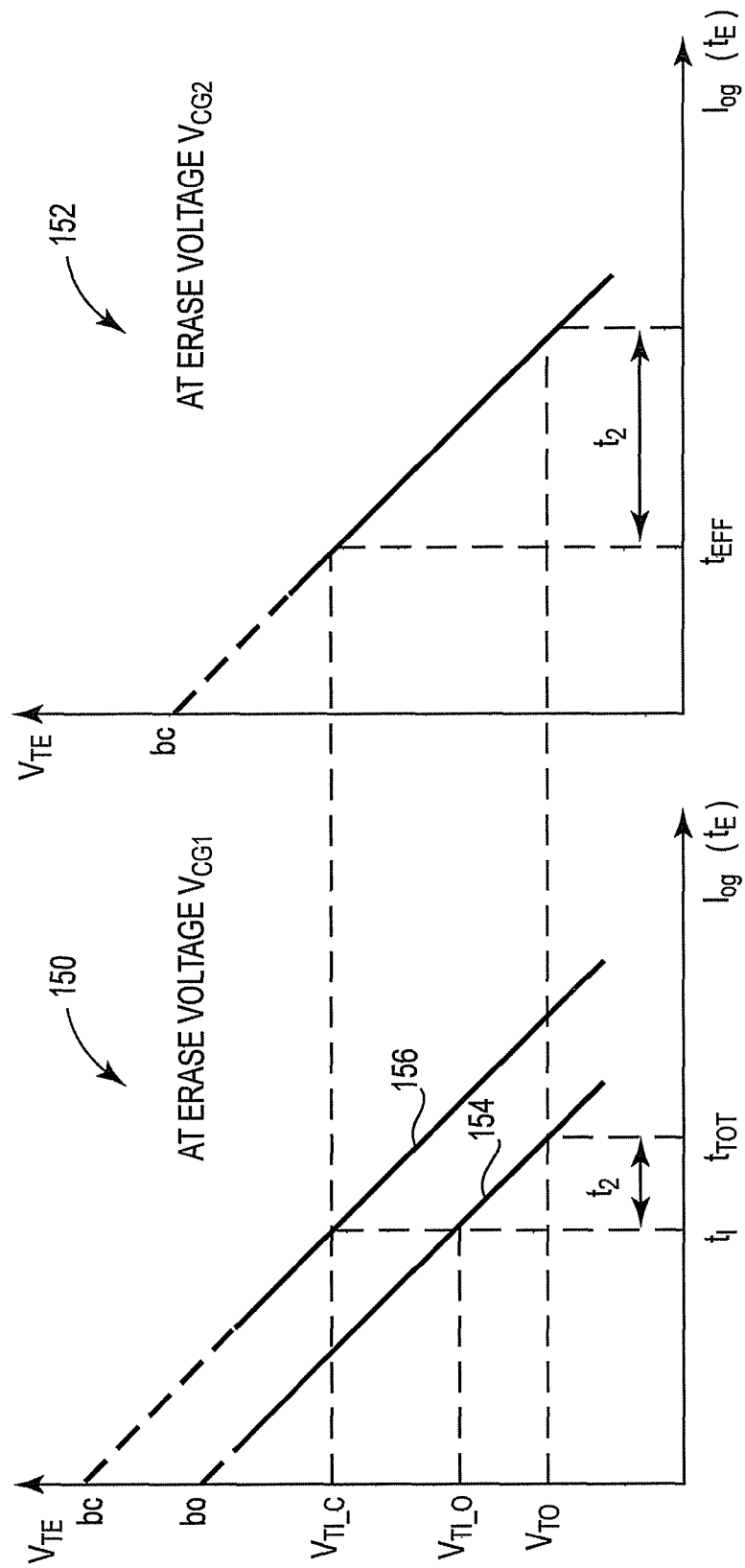
FIG. 7 is a graph illustrating the erased threshold voltage characteristics of a sample of flash cells at two different erase voltage levels.

FIGS. 6 and 7 below illustrate one example of a process for determining the voltage level of a second erase pulse based on the failed bit count measurement, according to one embodiment, when a FN erase scheme is employed.

FIG. 6 is a graph illustrating the FN erase characteristics or behavior for an example page of flash cells (e.g. page 44) in response to being erased with a range of erase voltages applied over a range of erase times $T_E$, according to one embodiment. The median erased threshold voltage $V_{TE}$ is indicated on the y-axis and the erase or hold time, $T_E$, is plotted logarithmically, log ($T_E$), on the x-axis. The small squares represent actual measured values of $V_{TE}$ resulting from various erase voltages being applied over the range of erase times. Each of the curves 130-138 represents data which is modeled to fit the measured points for a different erase voltage, with the erase voltages increasing in magnitude from curve 130 to curve 140. For example, curve 134 corresponds to a first erase voltage, $V_E$, and indicates the expected median $V_{TE}$ of the flash cells of the page of flash cells versus the erase or time $T_E$ the erase voltage is applied. From FIG. 6, it can be seen that the greater the erase voltage, the more quickly the flash cells can be erased to a given or desired $V_{TE}$.

FIG. 7 includes a pair of graphs 150 and 152 which respectively illustrate the $V_{TE}$ characteristics of an example page of flash cells at two different erase voltage levels, indicated as VCG1 and VCG2. FIG. 7, together with FIGS. 4 and 6, is used to illustrate and the below-described derivation of an equation for determining an optimal erase voltage level for a second erase pulse, such as erase pulse 122 of FIGS. 5A and 5B. It is noted this derivation is specific to a FN erase scheme, but that the teachings herein can be adapted for use with other types of erase schemes as well (e.g. hot electron erasing techniques).

Graph 150 includes curves 154 and 156, respectively illustrate the FN erased $V_{TE}$ characteristics of a page of flash cells in response to a first erase voltage, $V_{CG1}$, at the beginning of life of the flash cells, and after cycling of the flash cells. In FIG. 7, the value $V_{T0}$ represents the final target $V_{TE}$ that is desired to be achieved after application of both first and second erase pulses 120 and 122.

With reference to curve 154, after first erase pulse 120 having first erase voltage $V_{CG1}$ and an erase hold time of $t_1$ is applied to the flash cells at the beginning of life, the expected value of the median $V_{TE}$ is as indicated at $V_{T1\_0}$. As described above, after application of first erase pulse 120, the page is read using a predetermined verify level and the fail bit count 112 is determined. At the beginning of life, the fail bit count will be small, if not equal to zero, indicating that no cycling degradation has yet occurred and the $V_{TE}$ achieved through application of first erase pulse 120 will be very close to, if not equal to, the expected $V_{TE}$ level of $V_{T1\_0}$.

In this case (i.e. at the beginning of life), according to one embodiment, to achieve the final erased target value of $V_{T0}$, second erase pulse 122 is applied to page of flash cells at the same erase voltage $V_{CG1}$ as first erase pulse 120. The required erase hold time, $t_2$, of second erase pulse 122 is found by continuing to follow curve 154 downward until $V_{TE}$ is equal to the final target $V_{TE}$ value of $V_{T0}$. A total erase hold time, $t_{TOT}$, represents the erase hold time required for erase voltage $V_{CG1}$ to erase the flash cells to the final target value of $V_{T0}$. The erase hold time, $t_2$, of second erase pulse 122 is equal to $t_{TOT}$ minus the erase hold time $t_1$ of first erase pulse 120. In another embodiment, also at the beginning of life of the memory cells, the voltage of second erase pulse 122 is different from (e.g. greater than) that of first pulse 120.

When fail bit count 112 indicates that cycling degradation has occurred, cycling degradation $\Delta V_{T\_CYCLE}$ 114 is determined, as described above with respect to FIG. 4. Based on the measured cycling degradation $\Delta V_{T\_CYCLE}$ 114, the actual or measured median $V_{TE}$ of the page of flash cells after application of first erase pulse 120 at erase voltage $V_{CG1}$ is not equal to the expected value of $V_{T1\_0}$, but is instead equal to the value indicated at $V_{T1\_C}$, where $\Delta V_{T\_CYCLE}$ 114 is equal to the difference between $V_{T1\_C}$ and $V_{T1\_0}$.

According to one embodiment, to more quickly erase the flash cells to the final $V_{TE}$ target value of $V_{T0}$, an erase voltage $V_{CG2}$, which is greater than erase voltage $V_{CG1}$, is employed as the erase voltage for second erase pulse 122. Additionally, according to one embodiment, it is desired to keep the total erase hold time, $t_{TOT}$, at a fixed time over a life of the memory. According to such an embodiment, the erase hold time $t_2$ of second erase pulse 122 at the erase voltage level $V_{CG2}$ must then have same value $t_2$ as the second erase pulse 122 when at the erase voltage level $V_{CG1}$ at the beginning of life of the memory. As such, the erase voltage level $V_{CG2}$ must be determined that lowers or erases the median $V_{TE}$ of the flash cells from the level $V_{T1\_C}$ to the target value of $V_{T0}$ in the time $t2$.

It is also noted that the model of cycling degradation described herein assumes that there are fixed charges in the proximity of the floating gate which are responsible for the cycling degradation, which means that the cycling degradation does not affect the time behavior (i.e. the slope) of the FN erase. With this assumption, the system of equations described below with respect to FIG. 7 can be derived and solved to have a closed from solution for the second erase pulse voltage. However, even if the programming behavior after cycling does effect the time (such as the erase behavior described by the equations below), so long as the behavior is known, the techniques can be modified accordingly.

In view of the above assumption, and from the modeled $V_{TE}$ characteristics of FIG. 6 and the graphs 150, 152 of FIG. 7, $V_{TE}$ voltages $V_{T1\_C}$ and $V_{T0}$ can be expressed by Equations (a) and (b) as follows:

$$V_{T1\_C} = m \log(t_{EFF}) + A + V_{CG2} + \Delta V_{T\_CYCLE} \quad (a)$$

$$V_{T0} = m \log(t_{EFF} + t_2) + A + V_{CG2} + \Delta V_{T\_CYCLE} \quad (b)$$

In these equations, m and A are constants associated with the modeling of the VTE characteristic curves of FIG. 6, with the values of $b_0$ and $b_c$ in the graphs of FIG. 7 respectively being equal to $A + V_{CG1}$ and $A + V_{CG1} - \Delta V_{T\_CYCLE}$.

Solving for $V_{CG2}$, the voltage of second erase pulse 122 can be represented by Equation (c) as follows:

$$V_{CG2} = m \log\left(\frac{t_1}{t_{EFF} + t_2}\right) + V_{T0} + V_{CG1} - V_{T1\_C},$$

$$\text{where } t_{EFF} = \frac{t_2}{10^{\frac{V_{T0} - V_{T1\_C}}{m}} - 1}$$

In Equation (c), the values of $t_1$, $t_2$, $V_{T0}$, and $V_{CG1}$ are selected, the value m comes from the model of the FN erase behavior, the value of $V_{T1\_C}$ can be calculated from the known value of $V_{T1\_0}$ and the measured value of $\Delta V_{T\_CYCLE}$, and $T_{EFF}$ can be calculated as shown above, and represents the time for first erase pulse 120 if it had been at second erase voltage level $V_{CG2}$.

Using the above-derived Equation (c), after measuring the fail bit count after application of first erase pulse 120 at first erase voltage level $V_{CG1}$, the cycling degradation $\Delta V_{T\_CYCLE}$ 114 can be determined and, based on the values of the selected constants, the value of $V_{CG2}$ can be determined. Subsequent application of second erase pulse 122 at calculated second erase voltage of $V_{CG2}$ to the flash cells, after application of first erase pulse 120 at first erase voltage $V_{CG1}$, will erase the flash cells from a median $V_{TE}$ of $V_{T1\_C}$ to the final target value of $V_{T0}$.

It is noted that Equation (c) provides an optimal voltage value for $V_{CG2}$ over a continuous range of voltage levels. However, in some embodiments, the memory system, such as EEPROM 40 may not be capable of providing a continuous range of voltages. For example, in one embodiment, power controller 80 is configured to provide voltage levels in discrete steps, such as in 0.25 volt steps, for example. In one such embodiment, command execution module 50 determines and monitors the level of cycling degradation $\Delta V_{T\_CYCLE}$ 114, and when the level of $\Delta V_{T\_CYCLE}$ 114 exceeds a predetermined threshold level, increases the level of $V_{CG2}$ to the voltage level closest to a level as determined using Equation (c). According to such an embodiment, the level of $V_{CG2}$ is then increased over time in incremental steps rather than over a continuous range of values.

Figure 8:
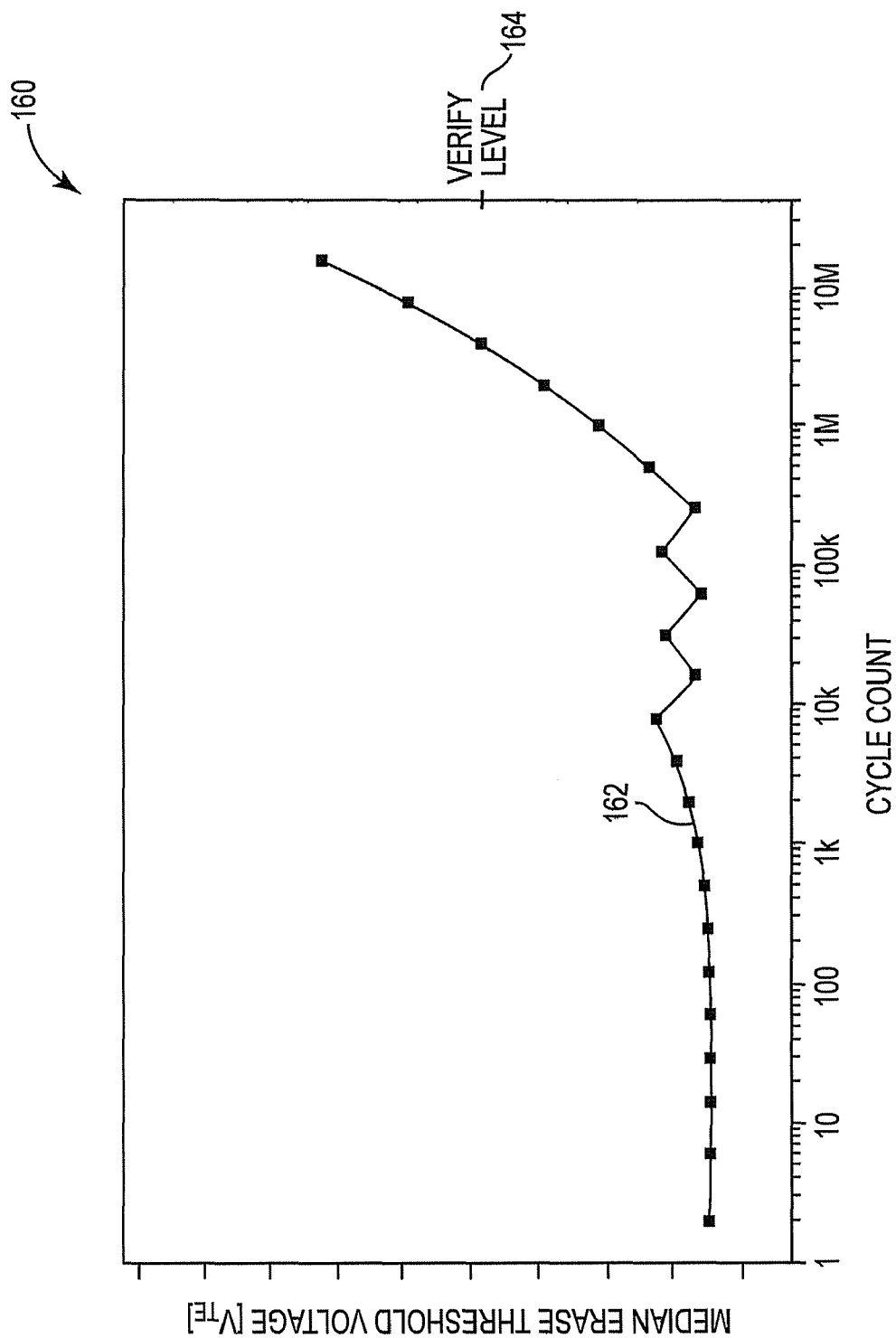
FIG. 8 is a graph illustrating the cycling endurance of an example non-volatile memory employing a predictive erase scheme according to one embodiment.

FIG. 8 is a graph 160 illustrating the median $V_{TE}$ of an array of flash cells of an EEPROM (e.g. array 42 of flash cells 90 of EEPROM 40) implemented using a predictive erase scheme, according to embodiments of the present disclosure, wherein the level of $V_{CG2}$ was increased using discrete voltage steps. The level of the median $V_{TE}$ is illustrated on the y-axis, and the write/erase cycle count is plotted logarithmically on the x-axis. Curve 162 represents the measured median $V_{TE}$, with the small rectangles representing measured data points. The verify level voltage is indicated at 164.

Initially, the level of cycling degradation $\Delta V_{T\_CYCLE}$ 114 was below the predetermined threshold level such that the voltage level employed for $V_{CG2}$ was equal to that of $V_{CG1}$. As the number of cycles increases, the level of $V_{TE}$ begins to increase. In the illustrated example, at approximately 8,000 cycles, the level of degradation $\Delta V_{T\_CYCLE}$ 114 exceeded the predetermined degradation threshold level, and the level of $V_{CG2}$ was increased to the voltage step closest to the level as determined based on Equation (c). Accordingly, the level of $V_{TE}$ decreases. After additional cycles, the level of $V_{TE}$ again begins to increase until $\Delta V_{T\_CYCLE}$ 114, at approximately 35,000 cycles, once again exceeds the predetermined degradation threshold level, and the level of $V_{CG2}$ is further increased to the voltage step closest to the level as determined based on Equation (c). This process continues until there is no longer the ability to further increase the level of the erase voltage.

According to one embodiment, although not explicitly illustrated, when the level of cycling degradation $\Delta V_{T\_CYCLE}$ 114 is below a predetermined threshold level, first erase pulse 120 is applied with a voltage level and for a duration that erases the flash cells to the final target value of $V_{T0}$, and the duration of second erase pulse 122 is adjusted or set to zero so that, effectively, second erase pulse 122 is not applied. According to such an embodiment, when the level of $\Delta V_{T\_CYCLE}$ 114 is greater than the predetermined threshold level, first erase pulse is and second erase pulse 120, 122 are applied as described above (e.g. at voltages $V_{CG1}$ and $V_{CG2}$, respectively).

Although the above described derivation and examples are primarily with respect to a predictive erase scheme employing a single first erase pulse having fixed parameters and single second erase pulse having a set or fixed erase hold time $t_2$ and an adjustable erase voltage level $V_{CG2}$ based on the measured cycling degradation, other embodiments of the predictive erase scheme may be employed. For example, in one embodiment, the erase voltage level $V_{CG2}$ of the second erase pulse is at a fixed level and the erase hold time $t_2$ is varied based on the measured cycle degradation $\Delta V_{T\_CYCLE}$ 114. In another embodiment, more than one fixed first erase pulse is applied to the page of flash cells prior to determining the cycle degradation $\Delta V_{T\_CYCLE}$ 114.

In one embodiment, more than one adaptive second erase pulse is applied to the flash cells, wherein at least one of the parameters of each of the second erase pulses is determined based on the measured cycle degradation $\Delta V_{T\_CYCLE}$ 114. In one embodiment, a series of erase pulses may be employed, with a cycle degradation being determined after each erase pulse, and with each subsequent erase pulse being adjusted based on the measured cycle degradation determined after preceding erase pulse. As can be seen, any number of potential variations of predictive erase schemes may be employed, based on the teaching of the present disclosure, wherein at least one erase pulse has at least one parameter which is adjusted based on a cycle degradation determined after application of at least one preceding erase pulse.

Figure 9:
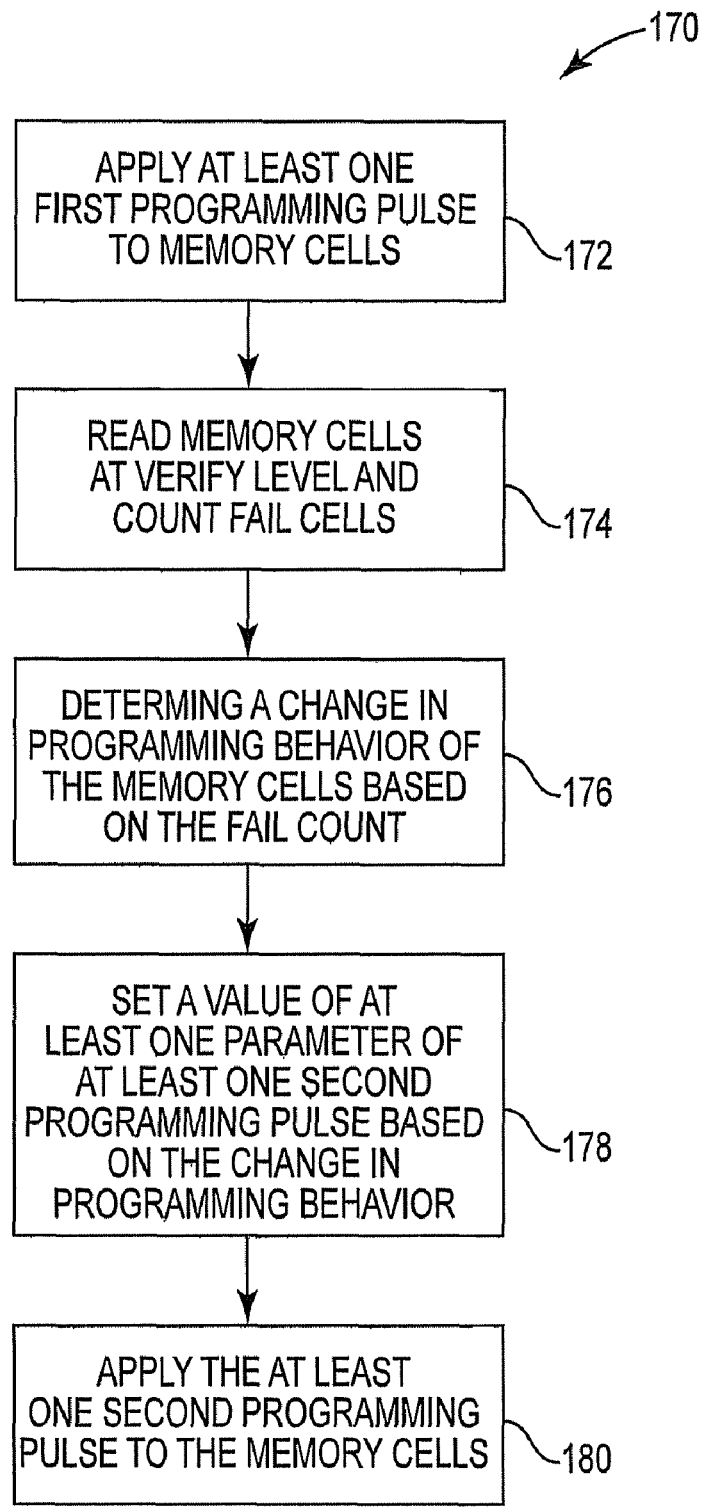
FIG. 9 is a flow diagram generally illustrating a predictive erase process according to one embodiment.

FIG. 9 is a flow diagram generally illustrating one embodiment of a predictive erase process 170, according to the present disclosure, such as employed by command execution module 50 of EEPROM 40 to erase the memory pages 44 of array 42. Process 170 begins at 172, with application of at least one first erase pulse, such as erase pulse 120, to a plurality of non-volatile memory cells so as to adjust a storage parameter of the memory cells. According to one embodiment, the memory cells comprise flash cells of an EEPROM, wherein the storage parameter is a threshold voltage. According to one embodiment, the at least one first erase pulse has a set of erase pulse parameters having fixed values. For example according to one embodiment, the at least one erase pulse comprises a voltage pulse having a fixed voltage and a fixed erase hold time.

At 174, after application of the at least one first erase pulse, a fail count of the non-volatile memory cells is determined by reading and comparing a level of the storage parameter of the memory cells to a verify level. According to one embodiment, memory cells having a storage parameter exceeding the verify level are included in the fail count. According to one embodiment, where the memory cells comprise flash cells of an EEPROM, the storage parameter comprises the threshold voltage of the memory cell, and the memory cells are read using a read voltage set to the verify level. Based on a current level provided by the memory cells in response to the read voltage, it is determined whether the threshold voltages of the individual memory cells exceed the verify level.

At 176, a change in the erase behavior of the non-volatile memory cells is determined based on the fail count determined at 174. For example, according to one embodiment, where the memory cells comprise flash cells of an EEPROM, change in erase behavior is determined based on a change in the normalized cumulative fail bit count of the plurality of memory cells after application of the first erase pulse to memory cells after cycles as compared to at the beginning of life of the memory cells, as described above with respect to FIG. 4.

At 178, a value of at least one pulse parameter of at least one second erase pulse is set based on the change in erase behavior (e.g. cycle degradation $\Delta V_{T\_CYCLE}$ 114). For example, according to one embodiment, where the erase pulse comprises a voltage pulse, the voltage level of the second erase pulse is set as described above by FIGS. 4-7, such as via Equation (c). According to one embodiment, the voltage level of the at least one second pulse is adjusted based on the change in erase behavior, while the remaining pulse parameters, such as an erase hold time, are fixed.

At 180, the at least one second pulse is applied to the plurality of non-volatile memory cells to adjust the level of the storage parameter to a desired erased level. For example, with reference to FIG. 7, after application of the first erase pulse, the median erased threshold voltage, $V_{TE}$, of the memory cells was adjusted to a level indicated $V_{T1\_0}$, which is above a desired or target erased level of $V_{T0}$. After applying the second erase pulse to the memory cells, with the second erase pulse having a voltage level set as described above by 174, 176, and 178, of the median $V_{TE}$ of the memory cells is erased or adjusted to the desired or final target erased level of $V_{T0}$.

It is noted that, while the predictive programming scheme is illustrated and described herein primarily in terms of a predictive erase scheme and with respect to flash cells, in particular with respect to EEPROMs, the predictive programming scheme according to the present disclosure can be readily modified or adapted for used with any type of non-volatile memory such as floating gate NVMs, PCRAM, CBRAM, nano-crystal NVM, MONOS, TANOS, to name a few, and be employed for programming operations including both erasing and writing operations.

It is also noted, as described earlier, that the term "programming", as used herein, refers to adjusting a storage parameter of a non-volatile memory cell, either to a high level or a low level, including by writing (via a write pulses) and erasing (via erase pulses). According to one embodiment, the storage parameter comprises a threshold voltage. According to one embodiment, the storage parameter may comprise a threshold current.

By using a predictive programming scheme according to embodiments of the present disclosure, the erase time of a non-volatile memory can be reduced relative to conventional erase techniques using iterative pulsing because only two pulses are required. No look-up tables are required and a priori knowledge of the cycling degradation is not required. Also, by using a fixed erase hold time or programming hold time for both the first erase pulse and the second erase pulse, the total erase programming time for the memory will remain fixed over the life of the memory.

Furthermore, although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of operating an integrated circuit, the method comprising: applying at least one first programming pulse to a plurality of non-volatile memory cells to adjust a level of a storage parameter of each of the non-volatile memory cells, the at least one first programming pulse defined by a plurality of pulse parameters each having a fixed value; determining a fail count by measuring the number of non-volatile memory cells of the plurality of non-volatile memory cells having a storage parameter level exceeding a verify level; determining a change in a programming behavior of the plurality of non-volatile memory cells based on the fail count; adjusting a value of at least one pulse parameter of at least one second programming pulse defined by the plurality of pulse parameters to a desired value based on the change in programming behavior, and applying the at least one second programming pulse to the plurality of non-volatile memory cells.

2. The method of claim 1, wherein determining the fail count includes: applying a read signal having the verify level to each non-volatile memory cell of the plurality of non-volatile memory cells; determining for each non-volatile memory cell whether the storage parameter level exceeds the verify level based on a response of the non-volatile memory cell to the read signal; and including in the fail count each non-volatile memory cell having a storage parameter level exceeding the verify level.

3. The method of claim 1, wherein determining a change in programming behavior includes determining a difference between the fail count and an expected fail count after application of the at least one first programming pulse to plurality of non-volatile memory cells, wherein the difference is representative of the change in programming behavior.

4. The method of claim 1, wherein the pulse parameters include a pulse magnitude and a pulse duration.

5. The method of claim 4, wherein the pulse duration of the at least one second programming pulse is fixed so that a sum of the durations of the at least one first programming pulse and the at least one second programming pulse is a constant.

6. The method of claim 4, wherein adjusting the value of the at least one pulse parameter comprises adjusting the pulse magnitude of the at least one second programming pulse.

7. The method of claim 4, wherein adjusting the value of the at least one pulse parameter comprises adjusting the duration of the at least one second programming pulse.

8. The method of claim 7, including adjusting the duration of the at least one second programming pulse to a duration of zero.

9. The method of claim 1, the change in programming behavior comprises a change between a level of the storage parameter achieved by application of the at least one first programming pulse at a beginning of life of the integrated circuit and a level of the storage parameter achieved by application of the at least one first programming pulse after a plurality of programming cycles.

10. The method of claim 1, wherein the storage parameter comprises a threshold voltage or a threshold current.

11. The method of claim 1, wherein the at least one first programming pulse is insufficient to adjust the level of the storage parameter to a desired target level, and wherein the at least one second programming pulse adjusts the level of the storage parameter to a level substantially equal to the desired target level.

12. The method of claim 1, wherein the at least one first programming pulse and the at least one second programming pulse comprise erase pulses.

13. The method of claim 1, wherein the at least one first programming pulse and the at least one second programming pulse comprise write pulses.

14. An integrated circuit comprising: an array of non-volatile memory cells; and a controller configured to: apply at least one first programming pulse to the array of non-volatile memory cells to adjust a level of a storage parameter of each of the non-volatile memory cells, the at least one first programming pulse defined by a plurality of pulse parameters each having a fixed value; determine a fail count by measuring the number of non-volatile memory cells of the plurality of non-volatile memory cells having a storage parameter level exceeding a verify level; determine a change in a programming behavior of the plurality of non-volatile memory cells based on the fail count; adjust a value of at least one pulse parameter of at least one second programming pulse defined by the plurality of pulse parameters to a desired value based on the change in programming behavior, and apply the at least one second programming pulse to the plurality of non-volatile memory cells.

15. The integrated circuit of claim 14, wherein to determine the fail count, the controller is configured to: apply a read signal having the verify level to each non-volatile memory cell of the plurality of non-volatile memory cells; determine for each non-volatile memory cell whether the storage parameter level exceeds the verify level based on a response of the non-volatile memory cell to the read signal; and include in the fail count each non-volatile memory cell having a storage parameter level exceeding the verify level.

16. The integrated circuit of claim 14, wherein to determine the change in programming behavior, the controller is configured to determine a difference between the fail count and an expected fail count after application of the at least one first programming pulse to plurality of non-volatile memory cells, wherein the difference is representative of the change in programming behavior.

17. The integrated circuit of claim 14, wherein the pulse parameters include a pulse magnitude and a pulse duration.

18. The integrated circuit of claim 17, wherein the pulse duration of the at least one second programming pulse is fixed so that a sum of the durations of the at least one first programming pulse and the at least one second programming pulse is a constant.

19. The integrated circuit of claim 17, wherein to adjust the value of the at least one pulse parameter, the controller is configured to adjust the pulse magnitude of the at least one second programming pulse.

20. The integrated circuit of claim 17, wherein to adjust the value of the at least one pulse parameter, the controller is configured to adjust the duration of the at least one second programming pulse.

21. The integrated circuit of claim 14, wherein the change in programming behavior comprises a change between a level of the storage parameter achieved by application of the at least one first programming pulse at a beginning of life of the integrated circuit and a level of the storage parameter achieved by application of the at least one first programming pulse after a plurality of programming cycles.

22. The integrated circuit of claim 14, wherein the at least one first programming pulse is insufficient to adjust the level of the storage parameter to a desired target level, and wherein the at least one second programming pulse adjusts the level of the storage parameter to a level substantially equal to the desired target level.

23. The integrated circuit of claim 14, wherein the at least one first programming pulse and the at least one second programming pulse comprise erase pulses.

24. The integrated circuit of claim 14, wherein the at least one first programming pulse and the at least one second programming pulse comprise write pulses.

25. The integrated circuit of claim 14, wherein the storage parameter comprises a threshold voltage or a threshold current.

26. The integrated circuit of claim 14, wherein the integrated circuit comprises a non-volatile memory selected from the group consisting of EEPROMs, floating gate NVMs, PCRAM, CBRAM, nano-crystal NVM, MONOS, and TANOS.

* * * * *